United States Patent
Ispas

(10) Patent No.: US 11,846,671 B2
(45) Date of Patent: Dec. 19, 2023

(54) DATA RECOVERY METHOD AND MEASUREMENT INSTRUMENT

(71) Applicant: Rohde & Schwarz GmbH & Co. KG, Munich (DE)

(72) Inventor: Adrian Ispas, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 70 days.

(21) Appl. No.: 17/730,964

(22) Filed: Apr. 27, 2022

(65) Prior Publication Data

US 2022/0373596 A1 Nov. 24, 2022

(30) Foreign Application Priority Data

May 18, 2021 (EP) .................................... 21174334

(51) Int. Cl.
*G01R 31/317* (2006.01)
*G01R 31/3183* (2006.01)

(52) U.S. Cl.
CPC .................. *G01R 31/31709* (2013.01); *G01R 31/318371* (2013.01)

(58) Field of Classification Search
CPC ...... G01R 31/31709; G01R 31/318371; G01R 13/0272; H04L 1/0054; H04L 1/205
See application file for complete search history.

(56) References Cited

U.S. PATENT DOCUMENTS

| | | | |
|---|---|---|---|
| 6,961,317 B2 * | 11/2005 | Abramovitch | H04L 1/242 370/252 |
| 10,726,188 B1 * | 7/2020 | Keshavan | G06F 13/00 |
| 2006/0122814 A1 * | 6/2006 | Beens | G06F 15/7864 702/189 |
| 2006/0251200 A1 | 11/2006 | Miller | |

(Continued)

OTHER PUBLICATIONS

Duan, Y. and Chen Degang, "Accurate Jitter Decomposition in High-Speed Links", IEEE Computer Society, 2017—IEEE 35th VLSI Test Symposium (VTS), 6 pages.

(Continued)

*Primary Examiner* — Vineeta S Panwalkar
(74) *Attorney, Agent, or Firm* — CHRISTENSEN O'CONNOR JOHNSON KINDNESS PLLC

(57) ABSTRACT

A method for recovering data included in a digitally modulated signal is described. The digitally modulated signal includes a symbol sequence. The method includes providing a mathematical model of the digitally modulated signal, the mathematical model describing the digitally modulated signal in terms of the symbol sequence and describing the digitally modulated signal in terms of a step response and/or an impulse response, and wherein the mathematical model also takes disturbances into account; and processing the digitally modulated signal based on the mathematical model, thereby recovering the data included in the digitally modulated signal. The disturbances include a random disturbance component modelled as a Gaussian disturbance, and include an inter-symbol interference component modelled as Gauss- (Continued)

ian noise, and wherein a dependence of the at least one step response on the symbol sequence is neglected within the mathematical model. Further, a measurement instrument and a measurement system are described.

15 Claims, 3 Drawing Sheets

(56) References Cited

U.S. PATENT DOCUMENTS

2010/0246650 A1    9/2010   Erb
2015/0066409 A1    3/2015   Duff

OTHER PUBLICATIONS

Ispas, A. et al., Signal Model Based Approach to Joint Jitter and Noise Decomposition,: Rohde & Schwarz HmbH & Co. KG, White Paper; Version 01.00, Jun. 2020, 24 pages.
Mistry, D. et al., "A Novel Jitter Separation Method Based on Gaussian Mixture Model", IEEE, ~ International Conference on Pervasive Computing (ICPC), 4 pages, 2015.
"Understanding Jitter", Wavecrest Corporation, Jan. 1, 2001, pp. 1-7.

* cited by examiner

DATA RECOVERY METHOD AND MEASUREMENT INSTRUMENT

FIELD OF THE DISCLOSURE

Embodiments of the present disclosure generally relate to a data recovery method of recovering data comprised in a digitally modulated signal. Embodiments of the present disclosure further relate to a measurement instrument and to a measurement system.

BACKGROUND

Data recovery methods for recovering data comprised in a digitally modulated signal are known in a large variety from the state of the art.

Usually, a clock recovery is performed in order to obtain clock times. The digitally modulated signal is then sampled at the recovered clock times. Finally, the symbols comprised in the digitally modulated signal are determined by comparing the sampled values with one or several decision thresholds.

The number of symbols that are falsely determined per time interval is known as the so-called symbol error rate or symbol sequence error rate.

If the digitally modulated signal comprises large disturbances, the usual techniques known from the state of the art might not be sufficient anymore. There are further techniques that enhance the precision of the data recovery. However, these further techniques usually are computationally expensive.

Thus, there is a need for a data recovery method that allows for smaller symbol error rates while keeping the necessary computational resources low.

SUMMARY

Embodiments of the present disclosure provide a data recovery method of recovering data comprised in a digitally modulated signal. The digitally modulated signal comprises a symbol sequence. In an embodiment, the data recovery method comprises the following steps:

Receiving, by a signal input of a measurement instrument, the digitally modulated signal;

Providing, by a signal processing circuit of the measurement instrument, a mathematical model of the digitally modulated signal, wherein the mathematical model describes the digitally modulated signal in terms of the symbol sequence, wherein the mathematical model further describes the digitally modulated signal in terms of a step response and/or an impulse response, and wherein the mathematical model also takes disturbances into account; and Processing, by the signal processing circuit the digitally modulated signal based on the mathematical model, thereby recovering the data comprised in the digitally modulated signal;

In some embodiments, the disturbances comprise a random disturbance component modelled as a Gaussian disturbance, wherein the disturbances further comprise an inter-symbol interference component modelled as Gaussian noise, and wherein a dependence of the at least one step response on the symbol sequence is neglected within the mathematical model.

Therein and in the following, the term "disturbance" is understood to denote all kinds of perturbations of the digitally modulated signal that relate to an amplitude deviation of the digitally modulated signal and/or to a time shift of the digitally modulated signal.

For example, the disturbances may comprise jitter and/or noise. In some embodiments, the disturbances may comprise horizontal jitter, vertical jitter, horizontal noise and/or vertical noise. Therein, the term "horizontal" indicates that the cause is a temporal perturbation, while the term "vertical" indicates that the cause is an amplitude perturbation. Put another way, jitter may be caused by "horizontal" temporal perturbations and/or by "vertical" amplitude perturbations. Likewise, noise may be caused by "horizontal" temporal perturbations and/or by "vertical" amplitude perturbations.

The method according to embodiments of the present disclosure enhances the precision of the data recovery by accounting for the disturbances in the digitally modulated signal. In other words, the symbol error rate is reduced because the disturbances are incorporated into the data recovery method by the mathematical model.

However, the disturbances are modelled within the mathematical model such that the computational resources necessary for recovering the data under consideration of the disturbances are reduced.

In some embodiments, there are three simplifications within the mathematical model. Firstly, the random disturbance is modelled as a Gaussian disturbance, i.e. as a disturbance having a Gaussian probability distribution. Such a Gaussian distribution can be treated statistically with a rather low amount of computational resources.

Secondly, the inter-symbol interference component is modelled as Gaussian noise, i.e. as a disturbance having a Gaussian probability distribution. As already explained above, such a Gaussian distribution can be treated statistically with a rather low amount of computational resources.

Thirdly, the dependence of the at least one step response on the symbol sequence is neglected within the mathematical model. In general, a step response that is associated with the transition of a first symbol value to a second symbol value may be different from a step response that is associated with the transition of the second symbol value to the first symbol value. However, this dependence is neglected, thereby reducing the computational resources necessary to carry out the data recovery.

Thus, the data recovery method according to embodiments of the present disclosure allows for recovering the data even in the presence of large disturbances, while keeping the computational expenses low. In other words, the data recovery method according to embodiments of the present disclosure allows for recovering the data even if an eye diagram associated with the digitally modulated signal is closed.

In some embodiments, the mathematical model describes the digitally modulated signal in terms of the symbol sequence, the disturbances as well as the step response and/or the impulse response, for instance in terms of the symbol sequence, the disturbances and the step response or rather in terms of the symbol sequence, the disturbances and the impulse response.

According to an aspect of the present disclosure, the digitally modulated signal is, for example, a pulse-amplitude-modulation (PAM)-N coded signal or a non-return-to-zero (NRZ) signal, wherein N is an integer that is greater than or equal to two. Accordingly, if the digitally modulated signal is PAM-N coded, the digitally modulated signal may have N different signal levels. Accordingly, each symbol of the digitally modulated signal may take one of the N different signal levels. If the digitally modulated signal is a NRZ signal, the digitally modulated signal may have two different signal levels. Thus, the symbols of the digitally modulated signal are bits having one of two possible values.

According to another aspect of the present disclosure, the digitally modulated signal is, for example, sampled with a predefined sampling rate by a sampling circuit of the measurement instrument, thereby obtaining a set of signal samples associated with the digitally modulated signal, wherein the data is recovered based on the set of signal samples by the signal processing circuit. The set of signal samples may comprise several subsets of signal samples, wherein each subset may be associated with one symbol of the symbol sequence. In other words, a separate subset of signal samples may be determined for each symbol of the symbol sequence. Accordingly, the value of each symbol may be determined based on the respective subset of signal samples associated with the symbol, thereby recovering the data.

In an embodiment of the present disclosure, individual sample points of the set of signal samples are assigned to symbols of the symbol sequence in order to recover the data. A separate subset of signal samples may be determined for each symbol of the symbol sequence by assigning the individual sample points of the set of signal samples to symbols of the symbol sequence. Accordingly, the value of each symbol may be determined based on the respective subset of signal samples associated with the respective symbol.

In a further embodiment of the present disclosure, the predefined sampling rate is greater than a symbol rate of the digitally modulated signal. Thus, there are at least two different sample points associated with each symbol of the symbol sequence. This way, the data can be recovered with a reduced symbol error rate, as more information with respect to each symbol is available.

In some embodiments, a separate subset of signal samples may be determined for each symbol of the symbol sequence, wherein each subset comprises at least two sample points.

Of course, each subset may comprise more than two sample points. On average, each subset comprises $f_S/f_{sym}$ sample points, wherein $f_S$ is the sampling rate and $f_{symb}$ is the symbol rate.

In some embodiments, the predefined sampling rate is smaller than or equal to the Nyquist rate. In general, if the sampling rate is higher than the Nyquist rate, i.e. higher than twice the highest meaningful (i.e. data carrying) frequency of the digitally modulated signal, the digitally modulated signal can be reconstructed completely. However, such high sampling frequencies, e.g. several 10 GS/s, require rather expensive analog-to-digital converters. It has turned out that a sampling rate between the symbol rate and the Nyquist rate is sufficient in order to recover the data with high precision.

According to another aspect of the present disclosure, the data is recovered by, for example, a maximum likelihood technique applied to the set of signal samples. A separate subset of signal samples may be determined for each symbol of the symbol sequence by assigning the individual sample points of the set of signal samples to symbols of the symbol sequence. The maximum likelihood technique may be applied to the individual subsets in order to determine the respectively associated symbol, thereby recovering the data comprised in the digitally modulated signal.

In an embodiment of the present disclosure, the data is recovered without comparing samples of the set of signal samples with a decision threshold. Thus, the data may be recovered by the maximum likelihood technique without defining decision thresholds for the digitally modulated signal.

According to another aspect of the present disclosure, sample points that lie within a predefined area around a signal edge are, for example, neglected for recovering the data. The amplitude of the digitally modulated signal usually varies significantly in the vicinity of a signal edge, while the amplitude remains rather constant in a center area of the respective symbol. Thus, sample points that are associated with a center area of the respective symbol may yield more reliable information on the value of the respective symbol. By neglecting the sample points that lie within a predefined area around a signal edge, the less reliable information is discarded, and the overall precision of the data recovery method is enhanced.

Alternatively, the sample points that lie within a predefined area around a signal edge may be weighted with a weighting factor that is smaller than a weighting factor for samples in a center area of the respective symbol. In other words, no information is discarded, but the less reliable pieces of information (i.e. the samples in the vicinity of the signal edge) are weighted with a smaller weighting factor.

In a further embodiment of the present disclosure, a signal level histogram of the digitally modulated signal is determined in order to recover the data. The signal level histogram is a function that maps the amplitude of the digitally modulated signal to the number of times the respective amplitude has been observed. For example, the maximum likelihood technique may be applied to the signal level histogram in order to recover the data.

The random disturbance component may comprise a vertical random perturbation and a horizontal random perturbation. Therein, the term "horizontal" indicates that the cause is a temporal perturbation, while the term "vertical" indicates that the cause is an amplitude perturbation. Put another way, the random disturbance may be caused by "horizontal" temporal perturbations and/or by "vertical" amplitude perturbations.

For example, the random disturbances may comprise random jitter and/or random noise. In some embodiments, the disturbances may comprise horizontal random jitter, vertical random jitter, horizontal random noise and/or vertical random noise.

Embodiments of the present disclosure further provide a measurement instrument. In an embodiment, the measurement instrument comprises a signal input and a signal processing circuit. The signal input is configured to receive a digitally modulated signal, wherein the digitally modulated signal comprises a symbol sequence. The signal processing circuit is configured to process the digitally modulated signal based on a mathematical model, thereby recovering data comprised in the digitally modulated signal. The mathematical model describes the digitally modulated signal in terms of the symbol sequence. The mathematical model further describes the digitally modulated signal in terms of a step response and/or an impulse response. The mathematical model also takes disturbances into account. The disturbances comprise a random disturbance component modelled as a Gaussian disturbance. The disturbances further comprise an inter-symbol interference component modelled as Gaussian noise. A dependence of the at least one step response on the symbol sequence is neglected within the mathematical model.

In some embodiments, the measurement instrument is configured to perform any of the data recovery methods described above.

Regarding the further advantages and properties of the measurement instrument, reference is made to the explanations given above with respect to the data recovery method, which also hold for the measurement instrument and vice versa.

According to an aspect of the present disclosure, the measurement instrument is, for example, an oscilloscope, a signal analyzer, or a vector network analyzer. However, the measurement instrument may be established as any other type of measurement instrument that is suitable for performing the data recovery method described above.

According to another aspect of the present disclosure, the measurement instrument further comprises, for example, a sampling circuit. The sampling circuit is configured to sample the digitally modulated signal with a predefined sampling rate, thereby obtaining a set of signal samples associated with the digitally modulated signal, and wherein the signal processing circuit is configured to recover the data based on the set of signal samples. The set of signal samples may comprise several subsets of signal samples, wherein each subset may be associated with one symbol of the symbol sequence. In other words, a separate subset of signal samples may be determined for each symbol of the symbol sequence. Accordingly, the value of each symbol may be determined based on the respective subset of signal samples associated with the symbol, thereby recovering the data.

The sampling circuit may be established as an analog-to-digital converter (ADC) or may comprise an ADC.

The predefined sampling rate may be greater than a symbol rate of the modulated signal. Thus, there are at least two different sample points associated with each symbol of the symbol sequence. This way, the data can be recovered with a reduced symbol error rate, as more information with respect to each symbol is available.

In some embodiments, a separate subset of signal samples may be determined for each symbol of the symbol sequence, wherein each subset comprises at least two sample points.

Of course, each subset may comprise more than two samples. On average, each subset comprises $f_S/f_{sym}$ sample points, wherein $f_S$ is the sampling rate and $f_{symb}$ is the symbol rate.

In some embodiments, the predefined sampling rate is smaller than or equal to the Nyquist rate. In general, if the sampling rate is higher than the Nyquist rate, i.e. higher than twice the highest meaningful (i.e. data carrying) frequency of the digitally modulated signal, the digitally modulated signal can be reconstructed completely. However, such high sampling frequencies, e.g. several 10 GS/s, require rather expensive analog-to-digital converters. It has turned out that a sampling rate between the symbol rate and the Nyquist rate is sufficient in order to recover the data with high precision.

Embodiments of the present disclosure further provide a measurement system. In an embodiment, the measurement system comprises any one of the measurement instruments described above and a device under test, wherein the device under test is configured to generate the digitally modulated signal.

In some embodiments, the measurement instrument is configured to perform any of the data recovery methods described above.

Regarding the further advantages and properties of the measurement system, reference is made to the explanations given above with respect to the data recovery method, which also hold for the measurement system and vice versa.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed. Similarly, any steps described herein may be interchangeable with other steps, or combinations of steps, in order to achieve the same or substantially similar result. Moreover, some of the method steps can be carried serially or in parallel, or in any order unless specifically expressed or understood in the context of other method steps.

Figure 1:
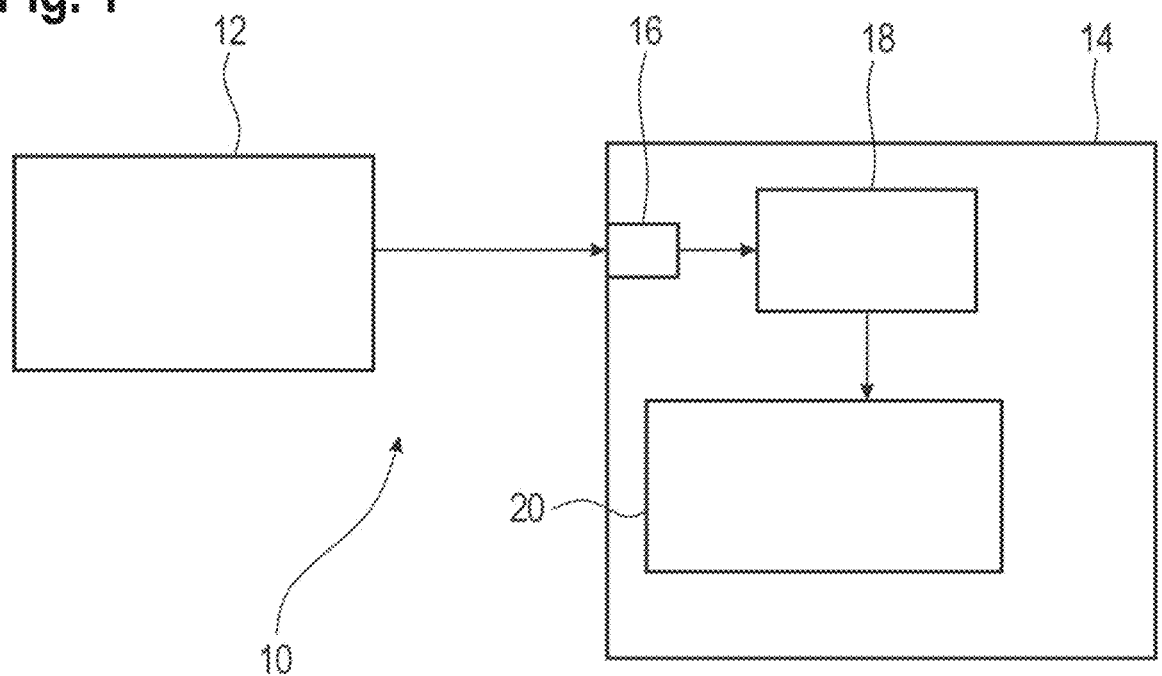
FIG. 1 schematically shows a measurement system according to an embodiment of the present disclosure.

FIG. 1 schematically shows an embodiment of a measurement system 10. The measurement system 10 comprises a device under test 12 and a measurement instrument 14. In general, the device under test 12 is an electronic device that is configured to generate a digitally modulated signal, wherein the digitally modulated signal comprises a symbol sequence. In some embodiments, the digitally modulated signal is a pulse-amplitude-modulation (PAM)-N coded signal or a non-return-to-zero (NRZ) signal, wherein N is an integer that is greater than or equal to two.

Accordingly, if the digitally modulated signal is PAM-N coded, the digitally modulated signal may have N different signal levels. Accordingly, each symbol of the digitally modulated signal is associated with one of the N different signal levels. In other words, there are N different possible symbol values. If the digitally modulated signal is a NRZ signal, the digitally modulated signal may have two different signal levels. Thus, the symbols of the digitally modulated signal are bits having one of two possible values.

The measurement instrument 14 may be an oscilloscope, a signal analyzer, or a vector network analyzer. However, the measurement instrument 14 may be established as any other type of measurement instrument that is suitable for performing the data recovery methods described hereinafter.

As shown in FIG. 1, the device under test 12 is connected with the measurement instrument 14 in a signal transmitting manner Therein and in the following, the term "connected in a signal transmitting manner" is understood to denote a cable-based or wireless connection that is configured to transmit signals between the respective devices or components. For example, the measurement instrument 14 may be connected to a measurement probe, wherein the measurement probe may contact one or several predefined contact points of the device under test 12 in order to pick up a signal from the device under test 12.

In the embodiment shown in FIG. 1, the measurement instrument 14 comprises a signal input 16 that is connected with the device under test 12, an analog-to-digital converter (ADC) 18, and a signal processing circuit 20.

In general, the measurement system 10 is configured to recover data comprised in the digitally modulated signal generated by the device under test 12, even if the digitally modulated signal comprises large disturbances.

Figure 2:
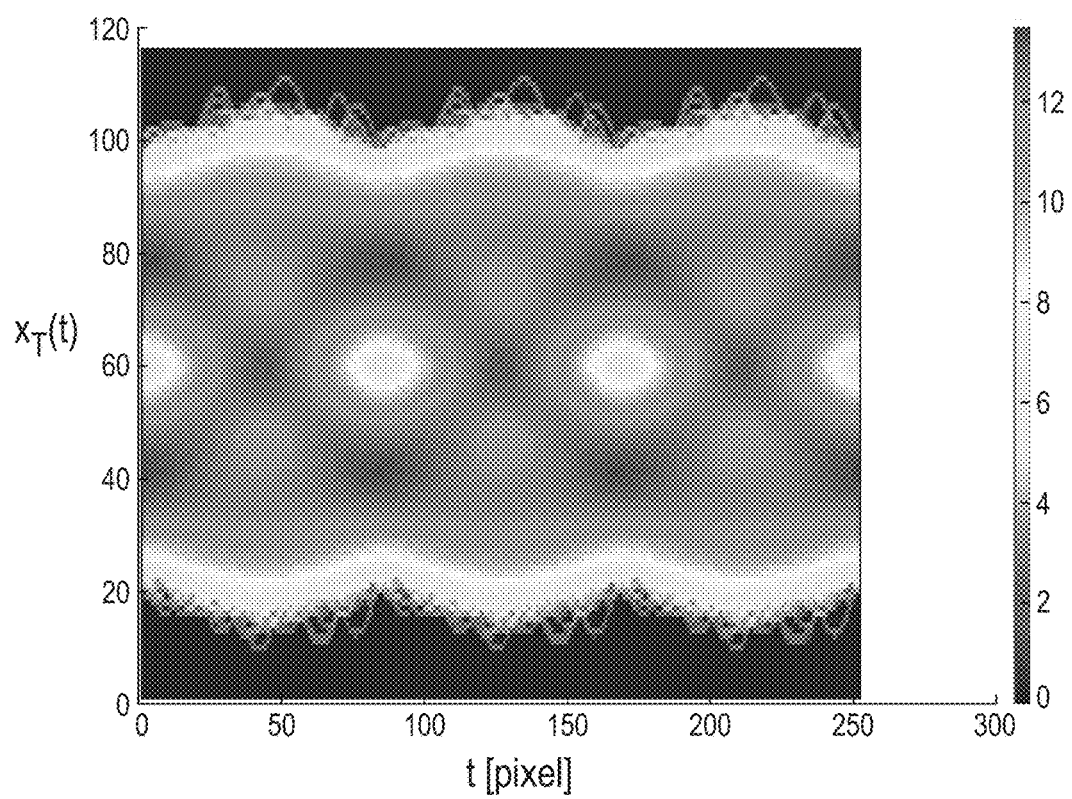
FIG. 2 schematically shows an eye diagram that is associated with a digitally modulated signal.

As is illustrated in FIG. 2, such large disturbances usually manifest in that an eye diagram associated with the digitally modulated signal is closed. For example, the disturbances may comprise jitter and/or noise. In some embodiments, the disturbances may comprise horizontal jitter, vertical jitter, horizontal noise and/or vertical noise. Therein, the term "horizontal" indicates that the cause is a temporal perturbation, while the term "vertical" indicates that the cause is an amplitude perturbation. Put another way, jitter may be caused by "horizontal" temporal perturbations and/or by "vertical" amplitude perturbations. Likewise, noise may be caused by "horizontal" temporal perturbations and/or by "vertical" amplitude perturbations.

Figure 3:
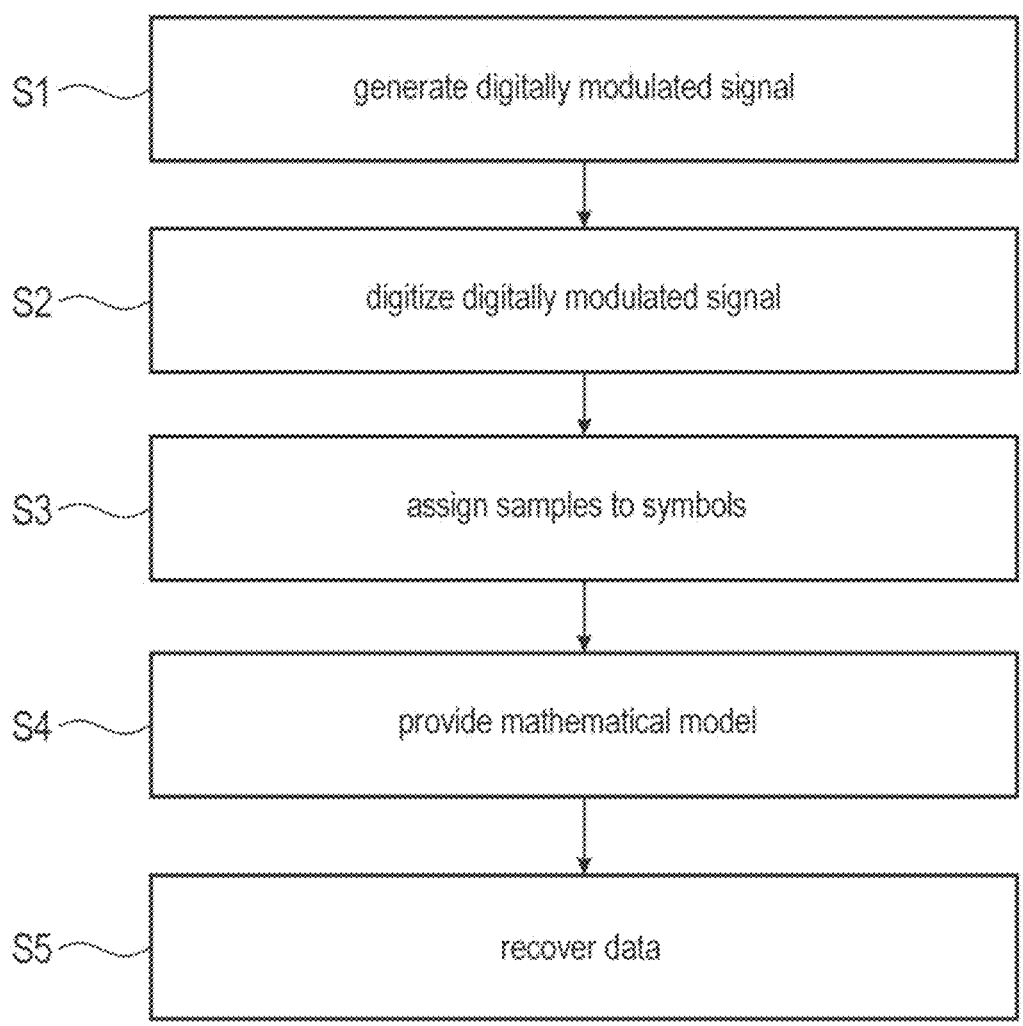
FIG. 3 shows a flow chart of a data recovery method according to an embodiment of the present disclosure.

The measurement system 10 is configured to recover the data comprised in the digitally modulated signal while taking such disturbances into account. In some embodiments, the measurement system 10 is configured to perform a data recovery method, an example of which is described in the following with reference to FIG. 3.

The digitally modulated signal is generated by the device under test 12 and forwarded to the signal input 16 (step S1).

The digitally modulated signal is received by the signal input 16 and digitized by the analog-to-digital converter 18, thereby obtaining a digitized digitally modulated signal (step S2).

Thus, the digitally modulated signal is sampled with a predefined sampling rate $f_S$, thereby obtaining a set of signal samples that is associated with the digitally modulated signal. The predefined sampling rate may be greater than a symbol rate $f_{sym}$ of the modulated signal. Thus, there may be at least two different sample points associated with each symbol of the symbol sequence. In some embodiments, there are $n=f_S/f_{sym}$ sample points associated with each symbol on average.

The sampling rate $f_S$ of the ADC 18 may be chosen to be an integer multiple of the symbol rate $f_{sym}$, such that the number n of samples associated with each symbol is an integer. In some embodiments, the predefined sampling rate $f_S$ may be smaller than or equal to the Nyquist rate.

In general, if the sampling rate is higher than the Nyquist rate, i.e. higher than twice the highest meaningful (i.e. data carrying) frequency of the digitally modulated signal, the digitally modulated signal can be reconstructed completely. However, such high sampling frequencies, e.g. several GS/s or even several 10 GS/s, require rather expensive analog-to-digital converters. It has turned out that a sampling rate between the symbol rate and the Nyquist rate is sufficient for the data recovery method.

The digitized digitally modulated signal is forwarded to the signal processing circuit 20. The individual sample points of the set of signal samples are assigned to the corresponding symbols of the symbol sequence (step S3).

Thus, a separate subset of signal samples is determined for each symbol of the symbol sequence by assigning the individual sample points of the set of signal samples to the corresponding symbols of the symbol sequence. In other words, each subset may be associated with one symbol of the symbol sequence.

A mathematical model is provided, wherein the mathematical model describes the digitally modulated signal in terms of the symbol sequence and in terms of a step response and/or an impulse response, and wherein the mathematical model also takes disturbances into account (step S4).

In some embodiments, the mathematical model takes a random disturbance component into account.

The random disturbance component may comprise a vertical random perturbation and a horizontal random perturbation. Therein, the term "horizontal" indicates that the cause is a temporal perturbation, while the term "vertical" indicates that the cause is an amplitude perturbation. Put another way, the random disturbance may be caused by "horizontal" temporal perturbations and/or by "vertical" amplitude perturbations. For example, the random disturbances may comprise random jitter and/or random noise. In some embodiments, the disturbances may comprise horizontal random jitter, vertical random jitter, horizontal random noise and/or vertical random noise.

Moreover, the mathematical model takes inter-symbol interferences into account.

Within the mathematical model, the digitally modulated signal is modelled by the following equation:

$$y(kT_a) = \sum_{l=-\infty}^{\infty} (s[l] - s[l-1]) \cdot h_{sr}(kT_a - T_{clk}[l] + \epsilon_{h,D}[l] + \epsilon_{h,R}[l], s) + \quad (E.1)$$
$$y_{-\infty} + \epsilon_{v,D}(kT_a) + \epsilon_{v,R}(kT_a)$$

Therein, $T_a$ is the sampling period, s[k] is the symbol at index k, s is the vector of the transmitted symbol sequence, $h_{sr}(t, s)$ is the step response for the symbol vector s at time t, $T_{clk}[k]$ is the reference clock time at symbol index k, and $y_{-\infty}$ is the initial signal value.

The deterministic horizontal disturbance at index k is denoted by $\epsilon_{h,D}[k]$, the random horizontal disturbance at index k is denoted by $\epsilon_{h,D}[k]$, the deterministic vertical disturbance at time t is denoted by $\epsilon_{v,D}(t)$, and the random vertical disturbance at time t is denoted by $\epsilon_{v,R}(t)$.

Using a first-order Taylor approximation for $\epsilon_{h,R}[l]$, one obtains the approximation $$y(kT_a) \approx \sum_{l=-\infty}^{\infty} (s[l] - s[l-1]) \cdot h_{sr}(kT_a - T_{clk}[l] + \epsilon_{h,D}[l], s) + \quad (E.2)$$
$$y_{-\infty} + \epsilon_{v,D}(kT_a) + \epsilon_R(kT_a)$$

wherein $\epsilon_R(kT_a)$ denotes the total random disturbance.

The signal model can then be reformulated in terms of an impulse response instead of a step response as follows:

$$y(kT_a) \approx \sum_{l=-\infty}^{\infty} s[l] \cdot (h_{sr}(kT_a - T_{clk}[l] + \epsilon_{h,D}[l], s) - \quad (E.3)$$
$$h_{sr}(kT_a - T_{clk}[l+1] + \epsilon_{h,D}[l+1], s)) + \epsilon_{v,D}(kT_a) + \epsilon_R(kT_a)$$

and

-continued $$y(kT_a) \approx \sum_{l=-\infty}^{\infty} s[l] \cdot (h(kT_a - T_{clk}[l] + \epsilon_{h,D}[l], \Delta_{T,clk}[l+1] - \Delta_{T,\epsilon,h,D}[l+1], s)) + \epsilon_{v,D}(kT_a) + \epsilon_R(kT_a). \quad \text{(E.4)}$$

with $\Delta_{T,clk}[l+1]=T_{clk}[l+1]-T_{clk}[l]$, $\Delta_{T,\epsilon,h,D}[l+1]=\epsilon_{h,D}[l+1]-\epsilon_{h,D}[l]$, and the impulse response $$h(t,\Delta_T[k],s)=h_{sr}(t,s)-h_{sr}(t+\Delta_T[k],s). \quad \text{(E.5)}$$

In order to recover the data comprised in the digitally modulated signal with high precision while keeping the necessary computational resources as low as possible, the following three simplifications may be applied to the mathematical model described above:

First, the random disturbance is modelled as a Gaussian disturbance, i.e. as a disturbance having a Gaussian probability distribution.

Second, the inter-symbol interference component is modelled as Gaussian noise, i.e. as a disturbance having a Gaussian probability distribution.

Further, a dependence of the at least one step response on the symbol sequence is neglected within the mathematical model.

In general, a step response that is associated with the transition of a first symbol value to a second symbol value may be different from a step response that is associated with the transition of the second symbol value to the first symbol value. However, this dependence is neglected within the mathematical model.

By applying the simplification described above, one obtains:

$$y(kT_a) \approx s[l] \cdot h(kT_a - T_{clk}[l] + \epsilon_{h,D}[l], \Delta_{T,clk}[l+1] - \Delta_{T,\epsilon,h,D}[l+1]) + \epsilon_{v,D}(kT_a) + \epsilon_R(kT_a) + \epsilon_{ISI,l}(kT_a), k \in S_l \quad \text{(E.6)}$$

where $S_l$ denotes the set of sampling indices that are part of the symbol interval l and $$\epsilon_{ISI,l}(kT_a) = \sum_{m=-\infty, m \neq l}^{\infty} s[m] \cdot (h(kT_a - T_{clk}[m] + \epsilon_{h,D}[l], \Delta_{T,clk}[m+1] - \Delta_{T,\epsilon,h,D}[m+1], s)) \quad \text{(E.7)}$$

is the inter-symbol interference for symbol index l and sampling index k. The received samples that are part of $S_l$ are collected in the vector $y_l$, and its probability density function conditioned on the symbol $s[l]$ for known impulse response $h(kT_a-T_{clk}[l]+\epsilon_{h,D}[l], \Delta_{T,clk}[l+1]-\Delta_{T,\epsilon}[l+1]$ is (for zero-mean random disturbance and ISI) given $$p(y_l|s[l]) \approx \frac{1}{\sqrt{\prod_{k \in S_l} 2\pi\sigma_{T,k}^2}} \cdot \exp\left(-\sum_{k \in S_l} \frac{(y(kT_a) - s[l] \cdot h(kT_a - T_{clk}[l] + \epsilon_{h,D}[l], \Delta_{T,clk}[l+1] - \Delta_{T,\epsilon,h,D}[l+1]) - \epsilon_{v,D}(kT_a))^2}{2\sigma_{T,k}^2}\right) \quad \text{(E.8)}$$

with the total variance $\sigma_{T,k}^2=\sigma_R^2+\sigma_{ISI,k}^2$ that is composed of the (total) random variance $\sigma_R^2$ and the ISI variance $\sigma_{ISI,k}^2$ at sampling index k.

The data comprised in the digitally modulated signal is recovered based on the mathematical model and based on the subsets of signal samples described above (step S5).

In other words, the values of the individual symbols of the symbol sequence are determined based on the mathematical model and based on the subsets of signal samples described above.

In some embodiments, the data is recovered by applying a maximum likelihood technique to the different subsets of signal samples.

As a result, the individual symbols are determined according to the equation $$\hat{s}[l] = \underset{s[l]}{\operatorname{argmax}} p(y|s[l]) = \underset{s[l]}{\operatorname{argmin}} \sum_{k \in S_l} \frac{(y(kT_a) - s[l] \cdot h(kT_a - T_{clk}[l] + \epsilon_{h,D}[l], \Delta_{T,clk}[l+1] - \Delta_{T,\epsilon,h,D}[l+1]) - \epsilon_{v,D}(kT_a))^2}{2\sigma_{T,k}^2} \quad \text{(E.9)}$$

Figure 4:
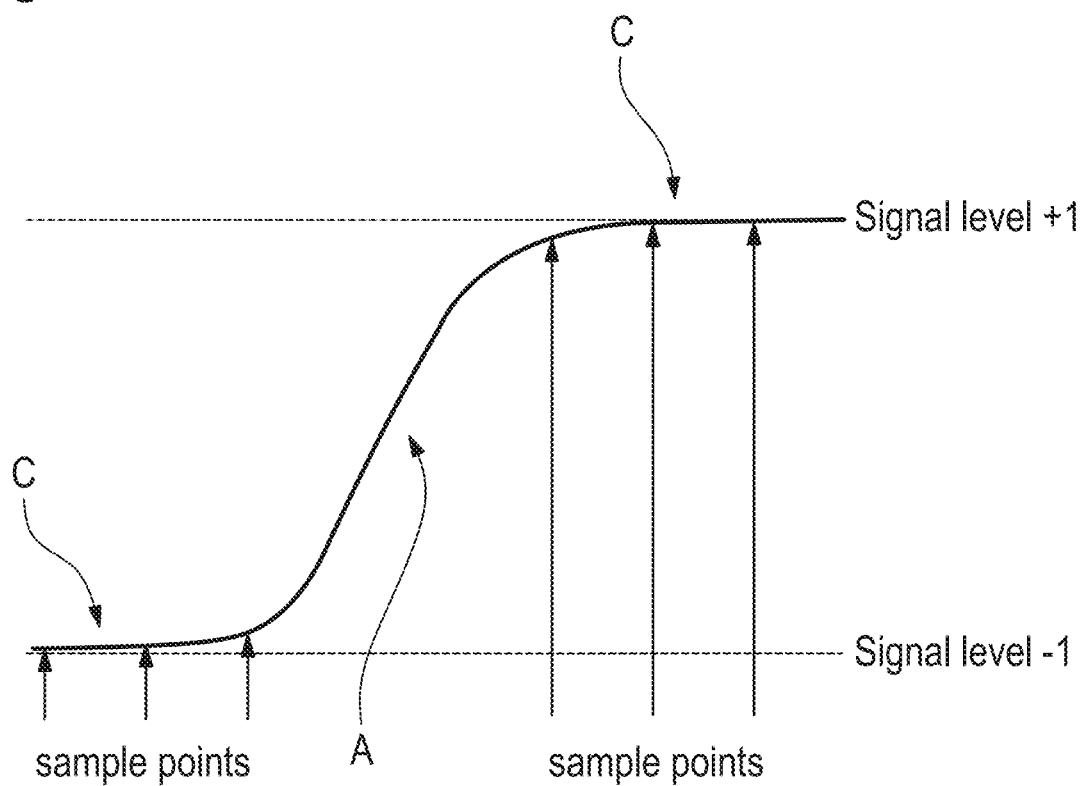
FIG. 4 shows a diagram of a representative digitally modulated signal plotted against time.

As shown in FIG. 4, sample points that lie within a predefined area A around a signal edge may be neglected for recovering the data. The neglected sample points are not used for determining the symbol values according to equation (E.9).

The amplitude of the digitally modulated signal usually varies significantly in the predefined area A, while the amplitude remains rather constant in a center area C of the respective symbols. Thus, sample points that are associated with a center area C of the respective symbol may yield more reliable information on the value of the respective symbol.

Alternatively, the sample points that lie within the predefined area A around a signal edge may be weighted with a weighting factor that is smaller than a weighting factor for samples in the center area C of the respective symbol.

In other words, no information is discarded in equation (E.9) in this case, but the samples in the vicinity of the signal edge are weighted with a smaller weighting factor.

In the representative case illustrated in FIG. 4, the digitally modulated signal can take one of two different symbol values, namely "Signal level+1" and "Signal level−1", and three samples are taken per symbol.

However, it is to be understood that any other number of samples may be taken per symbol. Moreover, the digitally modulated signal may have more than two different possible signal levels.

Optionally, equation (E.9) can further be simplified by assuming a constant term $$s[l] \cdot h(kT_a - T_{clk}[l] + \epsilon_{h,D}[l], \Delta_{T,clk}[l+1] - \Delta_{T,\epsilon,h,D}[l+1]) + \epsilon_{v,D}(kTa) \quad \text{(E.10)}$$

across k and l for each possible symbol value. This allows one to obtain a value for equation (E.10) for each possible symbol based on a signal level histogram.

Thus, in this case a signal level histogram of the digitally modulated signal may be determined in order to recover the data.

The data recovery described above enhances the precision of the data recovery by accounting for the disturbances in the digitally modulated signal. In other words, the symbol error rate is reduced because the disturbances are incorporated into the data recovery method by the mathematical model.

However, the disturbances are modelled within the mathematical model such that the computational resources necessary for recovering the data under consideration of the disturbances are reduced.

Thus, the data recovery methods described above allows for recovering the data even in the presence of large disturbances, while keeping the computational expenses low. In other words, the data recovery methods described above allows for recovering the data even if an eye diagram associated with the digitally modulated signal is closed.

Certain embodiments disclosed herein utilize circuitry (e.g., one or more circuits) in order to implement protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field programmable gate array (FPGA), a system on a chip (SoC), or the like, or any combinations thereof, and can include discrete digital or analog circuit elements or electronics, or combinations thereof.

In an embodiment, circuitry includes hardware circuit implementations (e.g., implementations in analog circuitry, implementations in digital circuitry, and the like, and combinations thereof). In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

In some embodiments, the functionality described herein can be implemented by special purpose hardware-based computer systems or circuits, etc., or combinations of special purpose hardware and computer instructions.

Various embodiments of the present disclosure or the functionality thereof may be implemented in various ways, including as non-transitory computer program products. A computer program product may include a non-transitory computer-readable storage medium storing applications, programs, program modules, scripts, source code, program code, object code, byte code, compiled code, interpreted code, machine code, executable instructions, and/or the like (also referred to herein as executable instructions, instructions for execution, program code, computer program instructions, and/or similar terms used herein interchangeably). Such non-transitory computer-readable storage media include all computer-readable media (including volatile and non-volatile media).

Embodiments of the present disclosure may also take the form of an apparatus, system, computing device, computing entity, and/or the like executing instructions stored on computer-readable storage media to perform certain steps or operations. The computer-readable media include cooperating or interconnected computer-readable media, which exist exclusively on a processing or processor system or distributed among multiple interconnected processing or processor systems that may be local to, or remote from, the processing or processor system. However, embodiments of the present disclosure may also take the form of an entirely hardware embodiment performing certain steps or operations.

Various embodiments are described above with reference to block diagrams and/or flowchart illustrations of apparatuses, methods, systems, and/or computer program instructions or program products. It should be understood that each block of any of the block diagrams and/or flowchart illustrations, respectively, or portions thereof, may be implemented in part by computer program instructions, e.g., as logical steps or operations executing on one or more computing devices. These computer program instructions may be loaded onto one or more computer or computing devices, such as special purpose computer(s) or computing device(s) or other programmable data processing apparatus(es) to produce a specifically-configured machine, such that the instructions which execute on one or more computer or computing devices or other programmable data processing apparatus implement the functions specified in the flowchart block or blocks and/or carry out the methods described herein.

These computer program instructions may also be stored in one or more computer-readable memory or portions thereof, such as the computer-readable storage media described above, that can direct one or more computers or computing devices or other programmable data processing apparatus(es) to function in a particular manner, such that the instructions stored in the computer-readable memory produce an article of manufacture including computer-readable instructions for implementing the functionality specified in the flowchart block or blocks.

The computer program instructions may also be loaded onto one or more computers or computing devices or other programmable data processing apparatus(es) to cause a series of operational steps to be performed on the one or more computers or computing devices or other programmable data processing apparatus(es) to produce a computer-implemented process such that the instructions that execute on the one or more computers or computing devices or other programmable data processing apparatus(es) provide operations for implementing the functions specified in the flowchart block or blocks and/or carry out the methods described herein.

It will be appreciated that the term computer or computing device can include, for example, any computing device or processing structure, including but not limited to a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof.

Accordingly, blocks of the block diagrams and/or flowchart illustrations support various combinations for performing the specified functions, combinations of operations for performing the specified functions and program instructions for performing the specified functions. Again, it should also be understood that each block of the block diagrams and flowchart illustrations, and combinations of blocks in the block diagrams and/or flowchart illustrations, or portions thereof, could be implemented by special purpose hardware-based computer systems or circuits, etc., that perform the specified functions or operations, or combinations of special purpose hardware and computer instructions.

In the foregoing description, specific details are set forth to provide a thorough understanding of representative embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure. Further, it will be appreciated that embodiments of the present disclosure may employ any combination of features described herein.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

Throughout this specification, terms of art may be used. These terms are to take on their ordinary meaning in the art from which they come, unless specifically defined herein or the context of their use would clearly suggest otherwise.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A data recovery method of recovering data comprised in a digitally modulated signal, wherein the digitally modulated signal includes a symbol sequence, the data recovery method comprising the following steps:
    receiving, by a signal input of a measurement instrument, the digitally modulated signal;
    providing, by a signal processing circuit of the measurement instrument, a mathematical model of the digitally modulated signal, wherein the mathematical model describes the digitally modulated signal in terms of the symbol sequence, wherein the mathematical model further describes the digitally modulated signal in terms of a step response and/or an impulse response, and wherein the mathematical model also takes disturbances into account; and
    processing, by the signal processing circuit, the digitally modulated signal based on the mathematical model, thereby recovering the data comprised in the digitally modulated signal;
    wherein the disturbances comprise a random disturbance component modelled as a Gaussian disturbance,
    wherein the disturbances further comprise an inter-symbol interference component modelled as Gaussian noise, and
    wherein a dependence of the at least one step response on the symbol sequence is neglected within the mathematical model.

2. The data recovery method of claim 1, wherein the digitally modulated signal is a PAM-N coded signal or a non-return-to-zero (NRZ) signal, wherein N is an integer that is greater than or equal to two.

3. The data recovery method according to claim 1, wherein the digitally modulated signal is sampled with a predefined sampling rate by a sampling circuit of the measurement instrument, thereby obtaining a set of signal samples associated with the digitally modulated signal, and wherein the data is recovered based on the set of signal samples by the signal processing circuit.

4. The data recovery method of claim 3, wherein individual sample points of the set of signal samples are assigned to symbols of the symbol sequence in order to recover the data.

5. The data recovery method according to claim 3, wherein the predefined sampling rate is greater than a symbol rate of the modulated signal.

6. The data recovery method according to claim, wherein the predefined sampling rate is smaller than or equal to the Nyquist rate.

7. The data recovery method according to claim 3, wherein the data is recovered by a maximum likelihood technique applied to the set of signal samples.

8. The data recovery method according to claim 7, wherein the data is recovered without comparing samples of the set of signal samples with a decision threshold.

9. The data recovery method according to claim 3, wherein sample points that lie within a predefined area around a signal edge are neglected for recovering the data.

10. The data recovery method according to claim 1, wherein a signal level histogram of the digitally modulated signal is determined in order to recover the data.

11. The data recovery method according to claim 1, wherein the random disturbance component comprises a vertical random perturbation and a horizontal random perturbation.

12. A measurement instrument, comprising:
    a signal input configured to receive a digitally modulated signal, wherein the digitally modulated signal comprises a symbol sequence; and
    a signal processing circuit configured to process the digitally modulated signal based on a mathematical model, thereby recovering data comprised in the digitally modulated signal,
    wherein the mathematical model describes the digitally modulated signal in terms of the symbol sequence, wherein the mathematical model further describes the digitally modulated signal in terms of a step response and/or an impulse response, and wherein the mathematical model also takes disturbances into account,
    wherein the disturbances comprise a random disturbance component modelled as a Gaussian disturbance, wherein the disturbances further comprise an inter-symbol interference component modelled as Gaussian noise, and wherein a dependence of the at least one step response on the symbol sequence is neglected within the mathematical model.

13. The measurement instrument of claim 12, wherein the measurement instrument is an oscilloscope, a signal analyzer, or a vector network analyzer.

14. The measurement instrument of claim 12, further comprising a sampling circuit configured to sample the digitally modulated signal with a predefined sampling rate, thereby obtaining a set of signal samples associated with the digitally modulated signal, and wherein the signal processing circuit is configured to recover the data based on the set of signal samples.

15. A measurement system, comprising:
a measurement instrument according to claim 12; and
a device under test,
wherein the device under test is configured to generate the digitally modulated signal.

\* \* \* \* \*